United States Patent
De Boer et al.

(10) Patent No.: US 7,056,424 B2
(45) Date of Patent: Jun. 6, 2006

(54) CATHODE FOR ELECTROCHEMICAL REGENERATION OF PERMANGANATE ETCHING SOLUTIONS

(75) Inventors: Reinhard De Boer, Berlin (DE); Sebastian Dünnebeil, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 601 days.

(21) Appl. No.: 10/276,166

(22) PCT Filed: May 15, 2001

(86) PCT No.: PCT/EP01/05526

§ 371 (c)(1),
(2), (4) Date: Nov. 12, 2002

(87) PCT Pub. No.: WO01/90442

PCT Pub. Date: Nov. 29, 2001

(65) Prior Publication Data

US 2003/0141198 A1   Jul. 31, 2003

(30) Foreign Application Priority Data

May 19, 2000 (DE) .............................. 100 25 551

(51) Int. Cl.
- C25B 11/16 (2006.01)
- C25B 11/04 (2006.01)
- C25B 11/03 (2006.01)

(52) U.S. Cl. ................ 204/290.01; 204/272; 204/283; 205/316; 205/333; 205/539; 29/746

(58) Field of Classification Search ................ 204/272, 204/290.01, 283; 205/475, 476, 539, 316, 205/333; 29/746
See application file for complete search history.

(56) References Cited

U.S. PATENT DOCUMENTS

| | | | |
|---|---|---|---|
| 3,470,044 A | | 9/1969 | Radimer |
| 4,175,023 A | * | 11/1979 | Argade et al. .............. 204/252 |
| 4,911,802 A | | 3/1990 | D'Ambrisi |
| 4,975,161 A | | 12/1990 | Nidola et al. |
| 5,062,930 A | | 11/1991 | Dillon et al. |

FOREIGN PATENT DOCUMENTS

| | | |
|---|---|---|
| DE | 689 23 085 T2 | 11/1989 |
| EP | 0 204 399 | 3/1986 |
| EP | 0 291 445 | 5/1988 |
| EP | 0 349 805 B1 | 6/1989 |
| EP | 0 336 542 A1 | 10/1989 |
| EP | 06306668 | 1/1994 |
| JP | 06206668 | 11/1994 |

OTHER PUBLICATIONS

W.P. Innes, Electrolytic Regeneration of Chromic Acid Etchants, Nov. 1978, 5 pages.

* cited by examiner

*Primary Examiner*—Bruce F. Bell
(74) *Attorney, Agent, or Firm*—Paul & Paul

(57) ABSTRACT

In order to regenerate permanganate solutions being utilized for the etching and roughening of plastics surfaces electrolytic methods are known. Though relatively small quantaties of by-products are produced with these methods as compared to chemical regeneration methods, large quantaties of manganese dioxide are produced when printed circuit boards are treated. In order to avoid formation of manganese dioxide during the regeneration method a novel cathode 2 has been found which is provided with a porous, electrically nonconducting layer 7 on the cathode body 3. The layer 7 preferably consists of a plastics material being resistant to acid and/or alkali.

13 Claims, 2 Drawing Sheets

CATHODE FOR ELECTROCHEMICAL REGENERATION OF PERMANGANATE ETCHING SOLUTIONS

FIELD OF THE INVENTION

Figure 1:
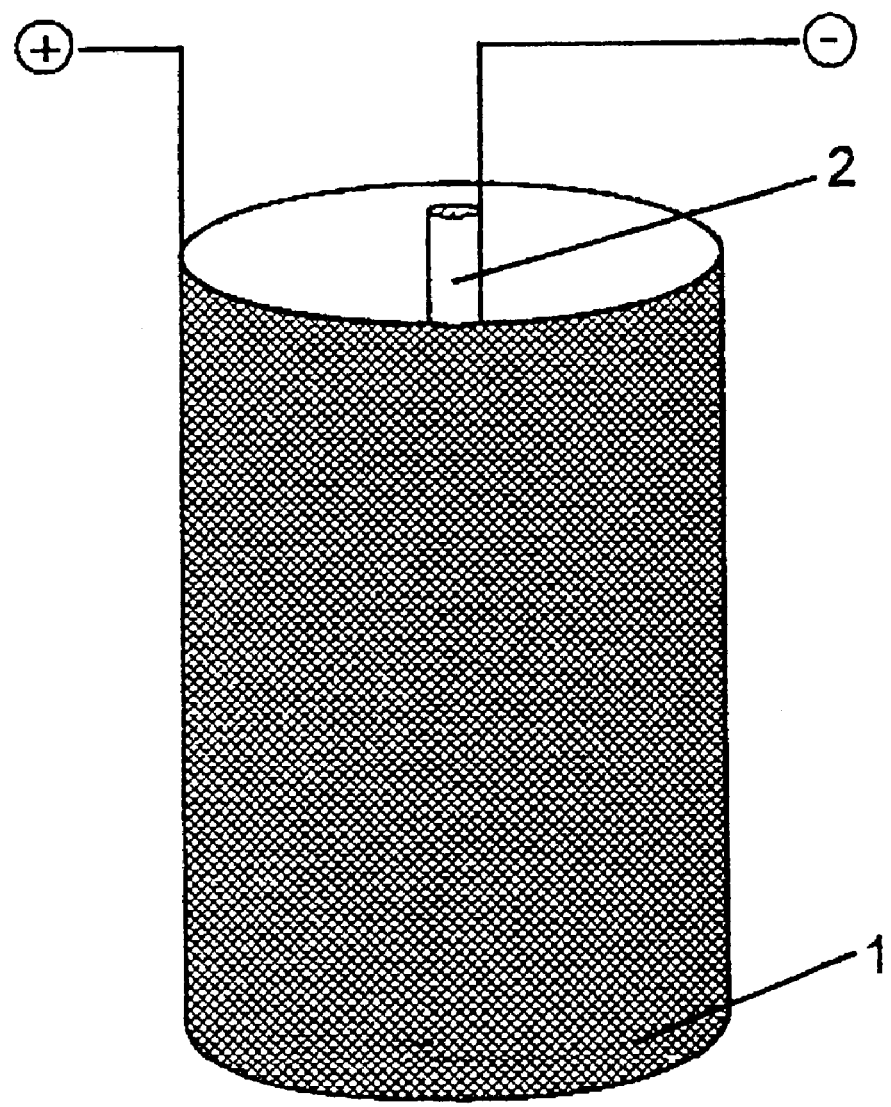

The invention relates to a cathode for an electrochemical arrangement for regeneration of permanganate etching solutions, a method for the manufacture thereof and a device for electrochemically regenerating permanganate etching solutions.

BACKGROUND OF THE INVENTION

Alkaline permanganate solutions are utilized for etching plastics material, for example in the manufacture of printed circuit boards but also prior to metallization of machined parts made of plastics for sanitary appliances, for the automotive industry, for precision mechanics industry or for furniture mountings. These solutions usually contain 30 to 100 g alkali permanganate and 30 to 100 g alkali hydroxide per 1 liter aqueous solution. The potassium permanganate being less expensive than sodium permanganate is normally used at a concentration below about 65 g/l and the considerably better soluble sodium permanganate is used at a higher concentration than 65 g/l. Typically potassium and sodium hydroxide are used as alkali hydroxide source. In general these solutions are operated at a temperature of from 60° C. to 98° C. Normally the plastics surfaces are treated with an organic swelling agent prior to the actual etching process in order to facilitate etching.

Due to the etching treatment of the plastics surfaces permanganate species are primarily reduced to manganate species, the manganate species on their part being disproportionated to permanganate species and to manganese dioxide. During this reaction considerable amounts of manganese dioxide sludge may be produced in the etching solution. A continuous operation of the method is not possible due to consumption of permanganate. Moreover the method is very expensive since permanganate salts must be added to the solution and waste material must be disposed of permanently.

In order to solve these problems a regenerating method has been developped. This method is described in EP 0 204 399 A1. In this method an oxidizing agent is added to the spent permanganate etching solution in an amount which is sufficient for reoxidizing manganate species in the etching solution with manganese compounds having an oxidation number being smaller than +VII thereby forming permanganate. Inorganic bromates, hypochlorites, chlorites, chlorates, peroxodisulfates, monopersulfates as well as the mixtures thereof are proposed as oxidizing agents. The oxidizing agents are reduced during the regenerating reaction and due to this reduction reaction are consumed.

This method has however proved to be complicated. Moreover additional substances are formed in the etching solution due to replenishment of the oxidizing agents. As a consequence the solution must be discarded. For this reason an electrochemical regenerating method has been developped, no undesirable reaction products being evolved due this method. Such a method ist described in EP 0 291 445 A2. This method is utilized to regenerate permanganate etching solutions serving to the roughening and cleaning of plastics surfaces, especially of printed circuit boards. The method consists of oxidizing manganese having an oxidation number of +VI to manganese having an oxidation number of +VII by electrochemical oxidation. This reaction is carried out in an electrochemical device and comprises an anodic reaction. For this purpose a cathode and an anode are arranged in an electrochemical device having a diaphragm preferably lying in between thereof. The anode and the cathode are connected to a current source in such a way that the cathode is polarized cathodically and the anode is polarized anodically. It has been explicitly pointed out in this document that optimum regeneration results are obtained with a device which is provided with two electrolyte compartments being separated from one another by a diaphragm. However, sufficient regeneration might also be achieved if a device would be used which is provided with one electrolyte compartment only, into which both electrodes are immersed.

Furthermore in EP 0 349 805 B1 a method is described for etching epoxy resin with an alkali permanganate etching solution with an etching rate of more than 3 μm, especially in bore holes in printed circuit boards, the etching solution containing 10 to 100 g/l alkali permanganate and at least 30 g/l alkali hydroxide. The method includes the following method steps: a. stabilizing the permanganate etching solution by electrochemical anodic oxidation at a direct current voltage of from 0.5 to 25 V and at a direct current density of from 0.1 to 20 A/cm$^2$; b. adjusting the permanganate and OH$^-$ ion concentration by electrochemical and/or photometric measurement and appropriate additional dosage in the event of a deviation from the desired value.

A similar application for electrochemically regenerating chemical oxidizing agents that are used in galvanotechnics has been described by W. P. Innes, W. H. Taller and D. Tomasello in *Plat. Surf. Finish.*, 1978, pages 36–40. This method relates to the regeneration of chromic acid etching solutions. In this case too the anode and the cathode of the regenerating device are separated from one another by a diaphragm, the diaphragm being a long porous ceramic cylinder.

A further application is disclosed in U.S. Pat. No. 3,470,044. The method described in this document relates to the eletrochemical regeneration of spent ammonium persulfate etching solutions. These solutions are inter alia utilized to dissolve metals, such as for example copper, cobalt, iron, nickel, zinc and the alloys thereof. For the regeneration reaction the etching solutions are passed through an anode compartment in an electrochemical cell, an anode being arranged in this compartment. This compartment is separated from a cathode compartment by a diaphragm this diaphragm being a cathode ion exchange membrane. A cathode is positioned in the cathode compartment. During operation of the electrochemical device persulfate is produced by oxidation of sulfate at the anode and metal ions are transferred to the cathode compartment the metal ions being reduced to elemental metal at the cathode.

A further device for regenerating permanganate etching solutions is disclosed in JP 6-306668 A. In this case the device comprises a regeneration container, the permanganate etching solution passing therethrough, further a plurality of cathodes and anodes being arranged in this container and being opposite to one another. The cathodes are partly covered by an electrically nonconducting layer, for example a polytetrafluor ethylene layer. For example the cathodes are designed as rods. The rods are only covered with the layer on certain sections. These sections alternate with other sections that are uncovered.

It has proven that the known methods for etching surfaces of plastics materials are complicated since either a large amount of chemicals is consumed for reoxidalizing manganese species having an oxidation number of less than +VII being formed due to the etching reaction or a large amount of energy is consumed. Especially it has turned out that a large amount of manganese dioxide sludge is formed in spite of continuous regeneration of the permanganate etching solution. This sludge must be isolated and discarded continuously. Moreover this sludge is blown up in the solution through the hydrogen evolved at the cathode so that this sludge possibly reaches the treatment container used for etching the plastics parts. Furthermore it has been observed after a long time of regenerating operation and connected herewith after a considerable sludge production that roughening of the plastics surfaces becomes uneven so that the degree of roughening of the plastics surfaces fluctuates.

Furthermore it has been observed, especially in cases in which large plastics surfaces per unit time are etched, that the efficiency of regeneration of permanganate gradually decreases. This behavior especially occurs when the SBU technique (sequential build up) is utilized. This technique involves a process in which individual circuit planes with plastics layers lying in between are manufactured sequentially. Each dielectric layer in circuit carriers must be cleaned and roughened with a permanganate etching solution in order to assure good adherence of the subsequent circuit line plane on this dielectric layer. Consumption of permanganate compounds and formation of the respective degradation products, for example of manganate and manganese dioxide, are considerable per unit time since large areas are to be treated with this process. Up to now a plurality of regenerating devices have been arranged in parallel in manufacturing plants in order to keep the concentration of permanganate in these solutions at the desired level at all. These devices require large floor space so that problems arise when the individual units are to be arranged side by side (treatment container and regenerating devices). These problems cannot be easily solved.

The problem of the present invention therefore comprises avoiding the disadvantages of known devices and methods and especially comprises finding a device being suitable for regeneration of permanganate etching solutions with high efficiency.

SUMMARY OF THE INVENTION

The present invention comprises a novel cathode for an electrochemical arrangement for regenerating permanganate etching solutions.

The present invention further comprises a novel device for electrochemically regenerating permanganate etching solutions.

The present invention also comprises a novel method for the manufacture of a cathode for an arrangement for electrochemically regenerating permanganate etching solutions.

The cathode according to the present invention being utilized in an electrochemical device for regenerating permanganate etching solutions is characterized by a porous, electrically nonconducting layer on the surface thereof. This layer is formed in such a way that electric current is able to flow therethrough. The term porous will be understood in the context of the present invention as being equivalent to perforations. Therefore not only cathodes having conventional porous material as a layer are comprised within the scope of the present invention but also cathodes being coated with a fabric material the pores being the interspaces between the meshes of the fabric.

The electrochemical regenerating device comprises at least one anode, at least one cathode according to the present invention, a current source for the at least one anode and the at least one cathode as well as electric conducting lines between the current source on the one hand and the at least one anode and the at least one cathode on the other hand.

The method according to the present invention comprises the following method steps: a. a cathode body is provided with a porous, electrically nonconducting layer, b. further the cathode body being provided with the layer is brought into contact with an alkaline permanganate solution containing manganate, c. an anode is brought into contact with the alkaline permanganate solution containing manganate and d. by means of an electric current source an electric current is produced in a current circuit being formed by the cathode and the anode in such a way that an insoluble layer is formed on the surface of the cathode, the layer at least predominantly containing manganese having an oxidation number of +IV.

When using conventional cathodes and regenerating devices, working up of the etching solutions caused problems since manganese dioxide sludge was produced in excessive quantities, the sludge hardly being separable by filtration. Due to the large manganese dioxide generation a thick sludge layer formed at the bottom of the electrochemical cells. Cathodes and anodes partly were immersed into this layer so that in these regions reoxidation of manganate to permanganate at the anode or a cathodic reaction at the cathode virtually was no longer possible. Further examination of the mechanisms occuring at the individual electrodes of conventional regenerating devices, which preferably were not equipped with a diaphragm between the anode and the cathode, led to the conclusion that permanganate was not predominantly reduced to manganate and further to manganese dioxide at the cathode, if the cathodic current density was sufficiently high. In this case the overvoltage at the cathode raised so much that predominantly hydrogen was generated at the cathode due to decomposition of water being used as a solvent in the etching solution. Due to generation of hydrogen the aforementioned electrochemical reaction was depressed. Therefore a further decrease of active cathode surface would actually had to lead to a further increase of efficiency of the regenerating reaction due to accumulation of manganese dioxide sludge at the bottom of the regenerating cell since in this case reduction of permanganate at the cathode would have been depressed in favor of hydrogen generation due to a further raise of current density and hence of overvoltage. Surprisingly just the opposite was observed when conventional devices were utilized, namely a decrease of efficiency when manganese dioxide sludge accumulated. The reason for this effect has not been found out.

Furthermore it has turned out that uneven etching with permanganate etching solutions was attributed to the fact that the composition of the etching solutions could no more be held constant easily due to the high material turnover in the solutions. Frequently the etching solutions could not be regenerated completely because an electrochemical regeneration was only possible if the maximum capacity of the devices being at the disposal for this purpose and being arranged in parallel was made use of. Therefore under these conditions the permanganate concentration was below the nominal value and the manganate concentration was above the respective value.

Using the cathode and the device according to the present invention the problems arising from utilizing conventional devices are eliminated:

By coating the cathode of the electrochemical regenerating device according to the present invention with a porous, electrically nonconducting layer on the surface thereof manganese compounds in the permanganate etching solution having an oxidation number of below +VII are reoxidized to permanganate with high efficiency. The efficiency being defined as the ratio of the electrochemical equivalent of the permanganate ions formed from manganate ions to the electric charge being turned over is improved by a factor of 2 to 5 if the cathodes according to the present invention are utilized in the electrochemical regenerating device. Due to the layer on the cathode surface the area being effective for the electrochemical reaction is decreased for example to the fifth part. However, the local current density raised as a result of this does not lead to the advantageous properties of the cathode according to the present invention. This may be easily seen from the fact that reduction of the surface area of the cathode due to reduction of the size of the cathode body does not have the same effect as the layer being deposited on the surface.

At the same time much less manganese dioxide sludge is generated as compared to the situation when conventional devices are used. Interestingly it has been observed that manganese dioxide being formed at the cathode according to the present invention sticks fixedly to the cathode surface as a dense coating and does not come off. Already for this reason much less sludge is generated. Therefore the further problem is also solved that hydrogen being evolved at the cathode of conventional devices blows up manganese dioxide sludge which could come into the treatment container for the plastics parts and there could cause problems.

The advantage of the cathodes according to the present invention and of the regenerating devices which are provided with these cathodes has especially favorable effects when the SBU technique is utilized in which large plastics surface areas are etched per unit time. Now in this case due to the increased efficiency of regeneration a smaller number of electrochemical regenerating devices according to the present invention having a lower electric total output is sufficient for keeping the etching conditions constant. Therefore in spite of a high material turnover when plastics surfaces are etched no considerable variations due to etching are noticed.

DETAILED DESCRIPTION OF THE PREFERRED EMBODIMENTS

The main issue of the present invention relates to a porous electrically nonconducting layer on the surface of the cathode of an electrochemical regenerating device.

The cathode is preferably entirely coated with the layer. The layer is designed such that electric current can flow therethrough even if the cathode is covered entirely with the layer.

Preferably a layer is used which is resistant to acid and/or alkali, and which is for example made of plastics material or of ceramics. In a preferred embodiment of the present invention the layer comprises and is preferably composed of a fabric especially fitting firmly to the cathode surface. In this case electric current can flow through the layer because gaps are formed between the meshes of the fabric. In another embodiment of the present invention the layer has small pores essentially or completely extending through the layer so that electric conductivity is ensured and is not made of a fabric but of a relatively dense material completely covering the cathode body.

The layer may especially comprise and preferably be composed of a material, selected from the group comprising polyalkylene and polyperhalogenalkylene and especially is composed of a material, selected from the group comprising polypropylene (PP), high density polyethylene (HDPE) and polytetrafluor ethylene. Especially preferred is a layer essentially consisting of a gauze made from polytetrafluor ethylene having a mesh size of from 70 to 100 μm. It is further favorable to use porous HDPE. In principle also porous ceramics may be used. Consequently in the meaning according to the present invention all materials in which electric current may flow via channels are understood as being suitable to form a porous layer.

Due to the electrochemical reaction of the manganese species at the cathode having an oxidation number higher than +IV, namely of $MnO_4^-$, $MnO_4^{2-}$ and of manganese species with manganese having an oxidation number of +V, an insoluble coating is formed at the cathode, this coating being insoluble and at least predominantly containing manganese having an oxidation number of +IV and being adsorbed on the cathode surface. This coating together with the porous electrically nonconducting layer forms a joined coating by the manganese dioxide coating if necessary filling out a gap between the cathode surface and the layer as well as the pores of the layer and the empty space in the fabric. It will be understood in the present case that manganese dioxide is defined by the reaction products being formed both due to electrochemical reaction and due to redox reactions taking place in homogeneous solution or heterogenously. Probably this material is pyrolusite but may also be any of the manganese dioxide minerals. A cathode containing this manganese species is also comprised in the scope of this invention.

The composite coating comprises both the porous, insoluble and electrically nonconducting layer and the coating formed in the gaps and pores of this layer. This composite coating is electrically conductive. This conductivity may be due to pores and gaps in the layer and pores in the coating but may also be due to pores and gaps in the layer and a certain electric conductivity of the coating itself. Electric conductivity of the coating may for example be due to a nonstoichiometric composition of the manganese dioxide which might be described by a formula such as $MnO_{2-x}$, x being a number between 0 and 1.

Therefore it is not necessary to leave the cathode surface partially open as is disclosed in JP 6-306668 A. In this case the cathode rods are only partially covered by a layer of an electrically nonconducting material. The main current will in this case be driven through those areas at the cathode surface which are free from this nonconducting layer.

The cathode body is provided with an electrically conductive surface and is preferably composed of metal. In an especially preferred embodiment of the invention the cathode body is made from copper or from special stainless steel which is also resistant to hot alkaline permanganate etching solutions. For example a V4A stainless steel may be used. Stainless steel is preferred over copper since a cathode body made from copper would have to be dismantled from the regenerating device on the occasion of cleaning the regenerating compartment because copper exhibits poor resistance if the material is polarized anodically.

Depending on the type, the layer may be mounted to the cathode body or be deposited as a fabricated material, the porous layer then being formed by an appropriate film forming method in this case. For example in the former case a tube is first manufactured from the layer material which is then mounted to the cathode body. If necessary a material is selected for the tube which may be shrunk onto the body. In case of the latter alternative for example a powder of the material is deposited on the cathode body and subsequently is sinter-fused thereto, the porous layer being formed during this method. In this way porous layers may also be manufactured made from ceramics for example.

Subsequently the cathode body provided with the layer and an anode are brought into contact with an alkaline permanganate solution containing manganate. For this purpose the permanganate solution can be identical with a typical permanganate etching solution. The conditions for generating the manganese dioxide coating may also be identical to the conditions being applied for etching plastics surfaces. If the cathode body provided with the porous layer is utilized directly in a permanganate etching solution in order to regenerate this solution being used for etching plastics surfaces the manganese dioxide coating is also formed upon starting current flow. An expanded metal part made of steel may be utilized as an anode as will be the case for regenerating the permanganate etching solution.

In order to produce the manganese dioxide coating electric current flow is generated in an electric circuit being formed by the cathode and the anode in such a way that the manganese dioxide coating is produced at the cathode surface. For this purpose the cathode and the anode are for example supplied with direct current. Preferably an initially reduced current flow is set. After switching on of an increased electric current this will be gradually increased until the typical manganese dioxide layer formation speed is achieved. Surprisingly deposition of manganese dioxide on the cathode surface does not proceed during normal operation of the regenerating device.

Preferably the cathode is formed as a rod, especially being made from a metal, preferably from steel. The anode is preferably designed as a perforated cylinder, the cathode being arranged axisymmetrically in the centre of the anode. Preferably the cylinder as well is composed of metal and especially is made from steel. Due to this arrangement an even current density distribution is achieved at the surfaces of the cathode and of the anode due to a symmetrical electric field in the space between the two electrodes. Because of that the electrochemical reactions may be set reproducibly at the electrode surfaces so that defined conditions are adjusted in the device.

Especially the anode may be made from expanded metal. Such anode embodiments may be manufactured very easily. Above all V4A steel may be utilized as material for the anode.

Preferably the ratio of the geometrical area of the anode to the geometrical area of the cathode is set to a value of at least 3:1 in order to minimize generation of manganese dioxide at the cathode. Most preferably a ratio of at least 10:1 may be set.

For the electrochemical regeneration a cathodic current density in the range of from 25 to 250 A/dm$^2$ is set. If a cathode body being designed as a rod, having a diameter of about 15 mm and being immersed into a permanganate bath for about 45 cm a total current at the cathode will result of about 50 A to about 500 A.

The regenerating device comprising the cathode according to the present invention and the anode may either be accomodated in a separate container, into which the permanganate etching solution is pumped by means of a pumping means via liquid conducting lines and from which the solution is passed back to the treatment container via other liquid conducting lines, or the regenerating device is integrated into the treatment container. If sufficient space is available for integrating the device into the treatment container, the latter alternative is more favorable, since the treatment solution may get to the regenerating device simply by convection in the container for treatment of the plastics parts. Moreover ideally no additionally pumps and liquid conducting lines are required. Since a considerably higher efficiency of the electrochemical reaction is achieved with the regenerating device according to the present invention than with conventional devices, the former may be realized in a smaller size than conventional devices. Therefore it is rather possible to arrange the regenerating device in the treatment container.

An embodiment not comprising a diaphragm between the cathode and the anode is more favorable than a corresponding embodiment comprising same, since the former is less prone to problems and because a smaller potential drop und hence a smaller electric power loss in the device results. In principle the regenerating device may also be equipped with a diaphragm separating the cathode compartment from the anode compartment.

The regeneration device is preferably utilized in a permanganate etching plant being used to treat printed circuit boards. It has proven especially favorable if a regenerating device is used in so-called horizontal plants in which the printed circuit boards are conveyed in a horizontal conveying path and brought into contact thereby with a permanganate etching solution. In this case the printed circuit boards are transported preferably in a horizontal alignment or in a vertical alignment. The advantage of such a combination results from the fact that large plastics surfaces may be treated per unit time, because the throughput of these horizontal plants is relatively big. Therefore the regenerating device must also have a high efficiency.

Figure 2:
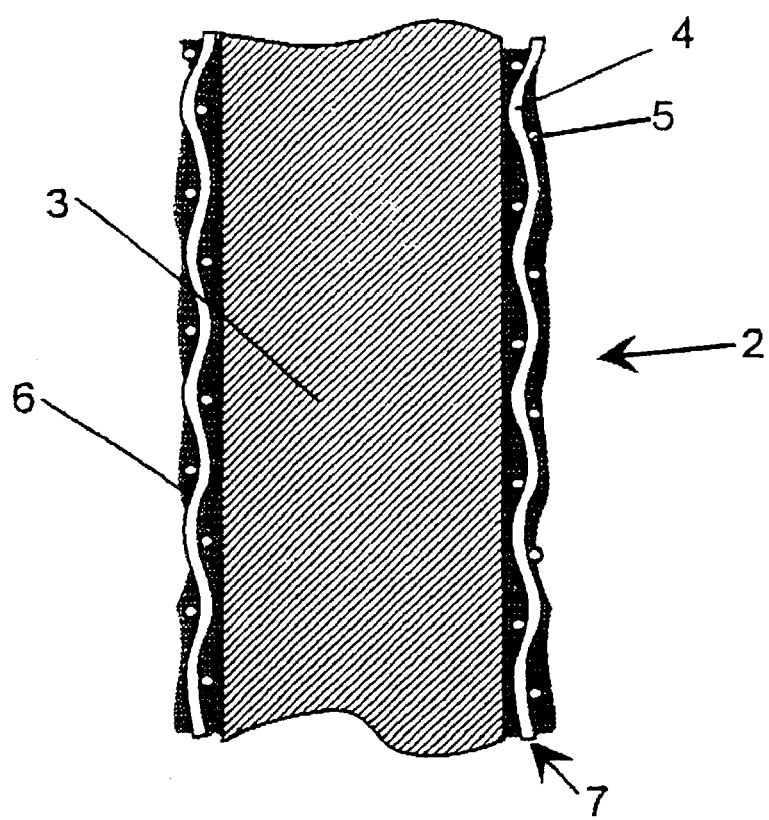
Figure 3:
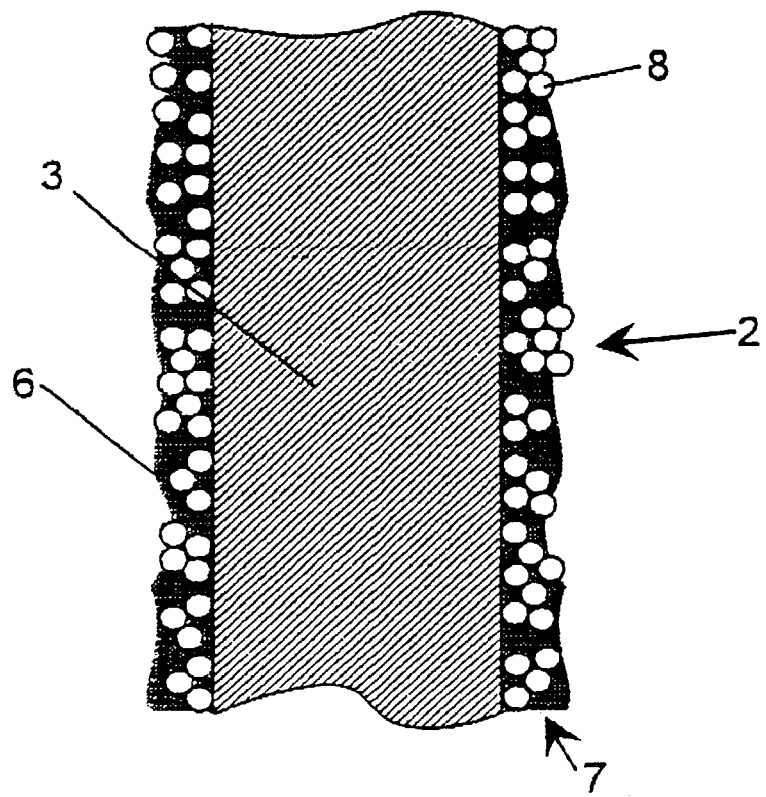

In order to more clearly describe the present invention the following figures are presented, showing preferred embodiments of the invention:

FIG. 1: schematic drawing of a anode/cathode couple in a regenerating device;

FIG. 2: cross section through a cathode according to the present invention in a first embodiment;

FIG. 3: cross section through a cathode according to the present invention in a second embodiment.

A schematic drawing of a regenerating device is shown in FIG. 1. The device may for example be employed in a treatment container for printed circuit boards.

The device comprises an anode 1 being made from an expanded metal of V4A steel and a cathode 2 according to the present invention. The anode 1 has a cylindrical shape. The cathode 2 is also composed of V4A steel and is designed as a rod. An easy convective passage of treatment liquid through the perforations of the anode 1 is made possible since the anode 1 is made from expanded metal. Therefore liquid is continuously exchanged between the anode 1 and the cathode 2 in the inside region of the device and renewed. The cathode rod 2 is arranged in the region inside the anode 1 in such a way that it is positioned axisymmetrically the anode cylinder.

In order to operate the regenerating device the cathode 2 is polarized cathodically and the anode 1 is polarized anodically.

A first embodiment of the cathode 2 according to the present invention is shown in FIG. 2 in a cross section. The cathode 2 comprises a cathode body 3 having a layer 7 which in this case is composed of a fabric having vertical meshes 4 and horizontal meshes 5. The fabric is mounted to the cathode body 3 as a tube. For example a fabric made from polytetrafluor ethylene (for example TEFLON® of DuPont de Nemours, Inc.) may be employed. Between the meshes 4,5 a manganese dioxide coating 6 is generated through an electrochemical reduction reaction in an alkaline permanganate solution.

In order to manufacture this layer the cathode 2 (rod diameter about 15 mm, depth of immersion into the permanganate solution about 45 cm) was brought into contact with a permanganate etching solution having the following composition:

65 g/l $KMnO_4$
50 g/l NaOH
in water at a temperature of 80° C. the reaction taking place in the regeneration device shown in FIG. 1. Subsequently a voltage was applied to the electrodes such that an electric current of 5 A flowed between the anode 1 and the cathode 2 (voltage of about 2 V). Due to the current flowing an initial manganese dioxide coating 6 between the meshes 4,5 of the fabric was formed. After about 20 min the current density at the surface of the cathode 2 was raised to about 10 A (voltage of about 3 V). After respective further 20 min a current of about 20 A (voltage of about 3.5 V), about 50 A (voltage of about 4.5 V), about 80 A (voltage of about 5 V) and finally about 100 A (voltage of about 5.4 V) were applied. The current flow was kept constant thereafter. At the end of treatment a firmly adsorbed manganese dioxide coating was formed on the cathode body 3.

If the layer made from the electrically nonconducting fabric is fastened to the cathode body 3 by means of Seeger circlip rings according to German standard DIN 471 or by means of stainless steel clips, the cathode 2 may be formed much quicker in the permanganate solution using the method indicated. The current decreases to nearly zero within 1 to 5 sec if too high currents are initially applied during the forming procedure, or the voltage rises very steeply so that inadmissable values for the voltage are achieved (starting from 8 V stainless steel dissolves electrolytically).

The forming method described is performed only once with a cathode 2. Subsequently this cathode 2 may be utilized in any way to regenerate permanganate solutions. Even after a long operation break the nominal electric current is applicable.

A further embodiment of a cathode 2 according to the present invention is shown in FIG. 3 in a cross section. In this case the cathode 2 is provided with a porous layer 7 of ceramics 8 which firmly adheres to the cathode body 3.

A manganese dioxide coating 6 in this case is formed in the pores of the layer of ceramics 8 due to treatment of the cathode body 3 provided with the layer 7 which has been produced under the same conditions being given for the cathode 2 in FIG. 2.

If the embodiments of the cathodes 2 shown in FIG. 2 and FIG. 3 are used regenerating devices can be manufactured which have the aforementioned advantageous properties.

In the following an example and a comparative example are given to more clearly describe the present invention:

EXAMPLE

In order to manufacture a rod-shaped cathode body having a diameter of 15 mm and made from V4A steel was coated with a single layer of a TEFLON® fabric having a mesh size of 70 μm. The coating was fixed to the cathode body by means of wire rings at spacings of 2 cm respectively. The diameter of the wire was 0.6 mm. The cathode body being prepared in this way was formed by gradual increase of the electric current, as described above, a manganese dioxide coating being generated on the cathode body.

The formed cathode was immersed into a permanganate bath having a volume of 350 l. The bath had been heated to a temperature of 80° C. The cathode was inserted into an anode with a diameter of 120 mm in a regenerating device as shown in FIG. 1, the anode being mounted in the bath and being formed from a basket made of expanded metal of V4A steel. For this purpose the cathode was fitted to a carrier (not shown) into the inner compartment of the cylindrical anode in such a way that it was positioned axisymmetrically to the anode.

The regenerating device was connected to a direct current source and immersed into a treatment container for printed circuit boards containing a permanganate etching solution comprising 65 g/l $KMnO_4$ and 50 g/l NaOH in an aqueous solution.

The current flowing in the regenerating device was set to 100 A at a voltage of 5.5 V.

Under the conditions the turnover speed amounted to 2 to 3 g $K_2MnO_4$ per liter bath and per hour. Manganese dioxide sludge was only produced in slight quantities.

COMPARATIVE EXAMPLE

The experiment given in the aforementioned example was repeated using a conventional cathode in this case having no coating at the surface. The size of the electrodes, the materials thereof and the other experimental conditions were selected to be identical to the size of electrode, materials and other experimental conditions given in the aforementioned example. Upon setting an electric current of 100 A a voltage of 5 V was adjusted.

Under the conditions described the turnover speed amounted only to 0.6 g $K_2MnO_4$ per liter bath and per hour. At the same time large quantities of manganese dioxide sludge were produced.

REFERENCE NUMERALS

1 anode
2 cathode
3 cathode body
4 vertical meshes of fabric
5 horizontal meshes of fabric
6 manganese dioxide coating
7 porous, insoluble, electrically nonconducting layer
8 layer of ceramics

The invention claimed is:

1. Cathode for an electrochemical arrangement for regenerating permanganate etching solutions, wherein the cathode (2) is provided with a composite coating comprising a porous, electrically non-conducting layer (7, 8) and a coating (6) on the surface thereof containing manganese having an oxidation number of +IV.

2. Cathode according to claim 1, wherein the cathode (2) is entirely coated with the non-conducting layer (7).

3. Cathode according to any one of the preceding claims 1–2, wherein the layer (7) comprises a plastics material resistant to acid and/or alkali.

4. Cathode according to any one of the preceding claims 1–2, wherein the layer (7) comprises a fabric (4,5) fitting firmly to the cathode (2).

5. Cathode according to any one of the preceding claims 1–2, wherein the layer (7) comprises a material, selected from the group consisting of polyalkylene and polyperhalogenalkylene.

6. Cathode according to any one of the preceding claims 1–2, wherein the layer (7) is composed of a material, selected from the group consisting of polypropylene, high density polyethylene and polytetrafluorethylene.

7. Cathode according to any one of the preceding claims 1–2, wherein the cathode (2) is formed as a rod.

8. Device for electrochemically regenerating permanganate etching solutions comprising
   a. at least one anode (1);
   b. at least one cathode (2) according to any one of claims 1–2;
   c. a current source for the at least one anode (1) and the at least one cathode (2); as well as
   d. electric conducting lines between the current source on the one hand and the at least one anode (1) and the at least one cathode (2) on the other hand.

9. Device according to claim 8 wherein the at least one cathode (2) is formed as a rod and the at least one anode (1) is formed as a perforated cylinder, each cathode (2) being arranged axisymmetrically in the centre of at least one anode (1).

10. Device according to claim 8, wherein the at least one anode (1) consists of expanded metal.

11. Device according to claim 8, wherein the ratio of the geometrical area of the at least one anode (1) to the geometrical area of the at least one cathode (2) is at least 3:1.

12. Method for the manufacture of a cathode for an arrangement for electrochemically regenerating permanganate etching solutions, wherein
   a. a cathode body (3) is provided with a porous, electrically nonconducting layer (7);
   b. the cathode body (3) provided with the layer (7) is brought into contact with an alkaline permanganate solution containing manganate;
   c. an anode (1) is brought into contact with the alkaline permanganate solution containing manganate; and
   d. by means of a electric current source an electric current is produced in a current circuit being formed by the cathode (2) and the anode (1) in such a way that an insoluble layer (6) is formed on the surface of the cathode (2), the layer (6) at least predominantly containing manganese having an oxidation number of +IV.

13. Method according to claim 12, wherein an initially low current is set, when method step d. is performed and that the current is further raised gradually.

* * * * *